United States Patent
Shibata

(10) Patent No.: US 9,711,404 B2
(45) Date of Patent: Jul. 18, 2017

(54) SEMICONDUCTOR DEVICE AND MANUFACTURING METHOD THEREOF

(71) Applicant: KABUSHIKI KAISHA TOSHIBA, Tokyo (JP)

(72) Inventor: Takeshi Shibata, Nonoichi Ishikawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 14/839,437

(22) Filed: Aug. 28, 2015

(65) Prior Publication Data

US 2016/0276222 A1   Sep. 22, 2016

(30) Foreign Application Priority Data

Mar. 16, 2015 (JP) ................. 2015-052738

(51) Int. Cl.
| | | |
|---|---|---|
| H01L 21/78 | (2006.01) | |
| H01L 29/66 | (2006.01) | |
| H01L 21/308 | (2006.01) | |
| H01L 21/306 | (2006.01) | |
| H01L 21/304 | (2006.01) | |
| H01L 21/31 | (2006.01) | |
| H01L 21/311 | (2006.01) | |
| H01L 29/778 | (2006.01) | |
| H01L 29/20 | (2006.01) | |

(Continued)

(52) U.S. Cl.
CPC ............ *H01L 21/78* (2013.01); *H01L 21/308* (2013.01); *H01L 21/3043* (2013.01); *H01L 21/30612* (2013.01); *H01L 21/30625* (2013.01); *H01L 21/31* (2013.01); *H01L 21/31116* (2013.01); *H01L 29/66462* (2013.01); *H01L 29/7787* (2013.01); *H01L 21/76816* (2013.01); *H01L 29/2003* (2013.01); *H01L 29/41758* (2013.01)

(58) Field of Classification Search
CPC ............ H01L 21/78; H01L 21/02381; H01L 21/0254; H01L 21/3043; H01L 21/30612; H01L 21/30625; H01L 21/308; H01L 21/31; H01L 21/31116; H01L 29/1079; H01L 129/1095; H01L 29/2003; H01L 29/66462; H01L 29/7787
USPC .......................................................... 257/76
See application file for complete search history.

(56) References Cited

U.S. PATENT DOCUMENTS 6,489,221 B2 * 12/2002 Gehrke ............... H01L 21/0242
257/E21.113
8,558,280 B2   10/2013 Sato
(Continued)

FOREIGN PATENT DOCUMENTS

JP   2009-130010 A   6/2009
JP   2011-192954 A   9/2011

OTHER PUBLICATIONS

Taiwanese Office Action dated Sep. 9, 2016, filed in Taiwanese counterpart Patent Application No. 104128933, 10 pages (with English translation).

*Primary Examiner* — Yasser A Abdelaziez
(74) *Attorney, Agent, or Firm* — Patterson & Sheridan, LLP

(57) ABSTRACT

A semiconductor device includes a substrate that includes a first region and a second region adjacent to the first region. The first region has a thickness that is smaller than a thickness of the second region, and a nitride semiconductor layer is provided on the first region of the substrate.

18 Claims, 12 Drawing Sheets

(51) Int. Cl.
*H01L 29/417* (2006.01)
*H01L 21/768* (2006.01)

(56) References Cited

U.S. PATENT DOCUMENTS

| | | |
|---|---|---|
| 8,624,296 B1 | 1/2014 | Wong et al. |
| 8,642,447 B2 | 2/2014 | Itou et al. |
| 2006/0214196 A1* | 9/2006 | Saxler ................ H01L 29/0649 257/243 |
| 2011/0180806 A1* | 7/2011 | Hebert ................ H01L 29/7787 257/76 |
| 2013/0271208 A1 | 10/2013 | Then et al. |
| 2014/0097449 A1 | 4/2014 | Takada |

* cited by examiner

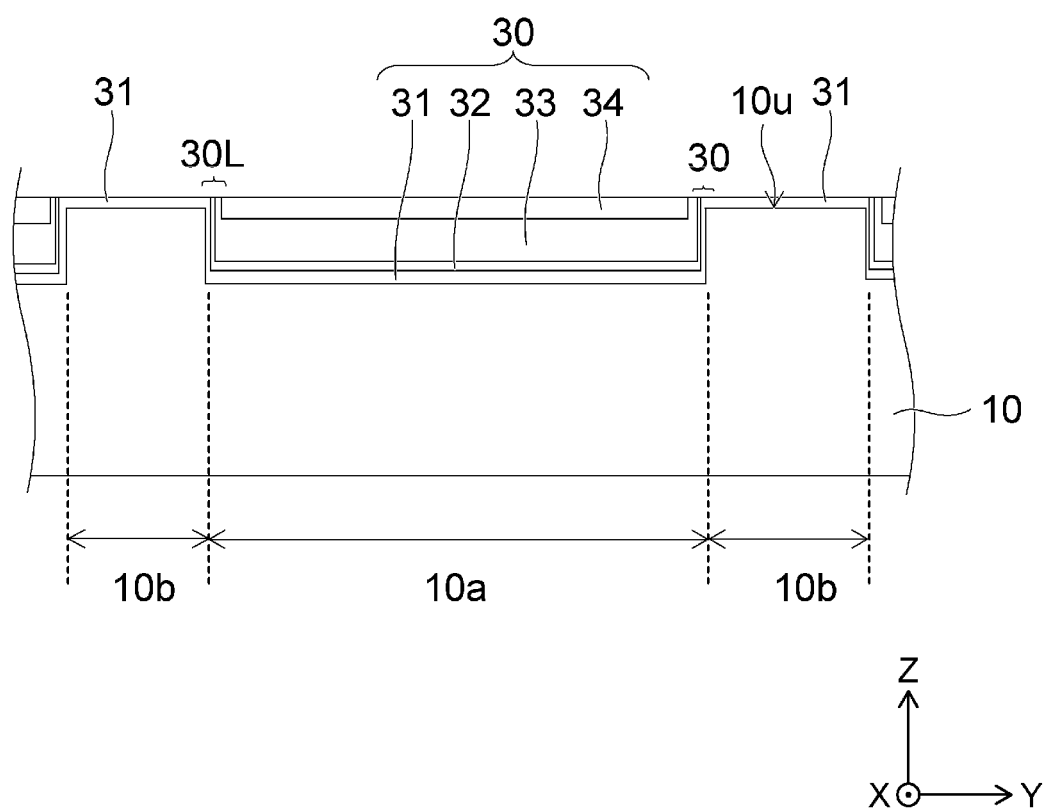

FIG. 11A
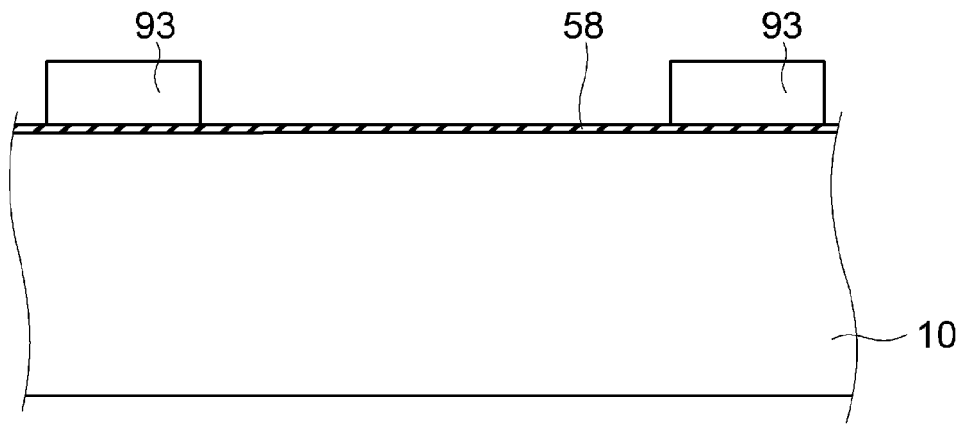
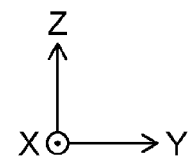
FIG. 11B
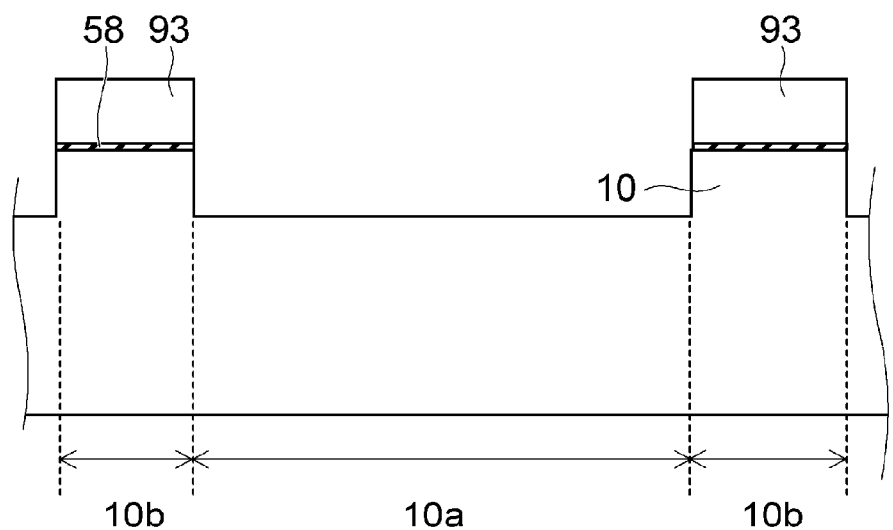
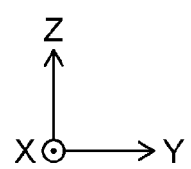

SEMICONDUCTOR DEVICE AND MANUFACTURING METHOD THEREOF

CROSS-REFERENCE TO RELATED APPLICATION

This application is based upon and claims the benefit of priority from Japanese Patent Application No. 2015-052738, filed Mar. 16, 2015, the entire contents of which are incorporated herein by reference.

FIELD

Embodiments described herein relate generally to a semiconductor device and a manufacturing method thereof.

BACKGROUND

A dicing process is carried out to dice a semiconductor device including a nitride semiconductor layer from a substrate or wafer. In the dicing process, a wafer-shaped substrate is cut by a dicing blade. However, when the dicing blade is applied to the substrate or wafer including the nitride semiconductor layer, because nitride semiconductor is harder than silicon, wear of the dicing blade is increased. Moreover, in addition to the wear of the dicing blade, the semiconductor device may be destroyed along with the nitride semiconductor layer due to mechanical impact of the dicing blade. Therefore, there is a method of exposing a substrate in which the nitride semiconductor layer is formed of the nitride semiconductor layer to an etchant and then cutting the substrate using the dicing blade in the etched recess. However, in this method, a side wall of the exposed nitride semiconductor layer may be infiltrated with water or other liquids used in cleaning the substrate after the etching process, and thereby the nitride semiconductor quality and performance may be deteriorated.

DESCRIPTION OF THE DRAWINGS

FIG. 10 is a schematic sectional view which shows the manufacturing process of the principal portion of the semiconductor device according to a modification example of the first embodiment.

FIGS. 11A to 11B are schematic sectional views which show the manufacturing process of the principal portion of the semiconductor device according to a second embodiment.

DETAILED DESCRIPTION

Figure 1A:
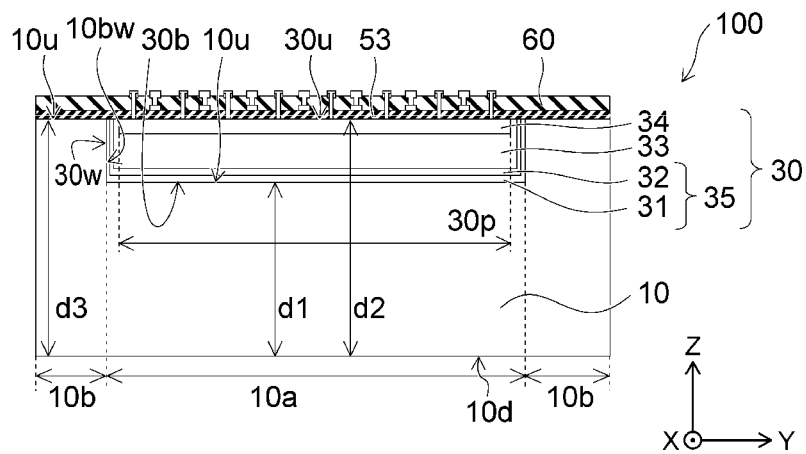
FIG. 1A is a schematic sectional view which shows a principal portion of a semiconductor device according to a first embodiment.

Embodiments provide a semiconductor device which suppresses the deterioration of a nitride semiconductor layer as a result of the manufacturing process of the device and a manufacturing method thereof.

In general, according to one embodiment, a semiconductor device includes a substrate that includes a first region and a second region adjacent to the first region. The first region has a thickness that is smaller than a thickness of the second region, and a nitride semiconductor layer is provided on the first region of the substrate.

Hereinafter, exemplary embodiments will be described referring to drawings. The same elements will be denoted by the same numerals, and appropriate description for elements described once will be omitted when appropriate. In the drawings, three-dimensional coordinates including X, Y, and Z axes are shown in some cases.

First Embodiment

Figure 1B:
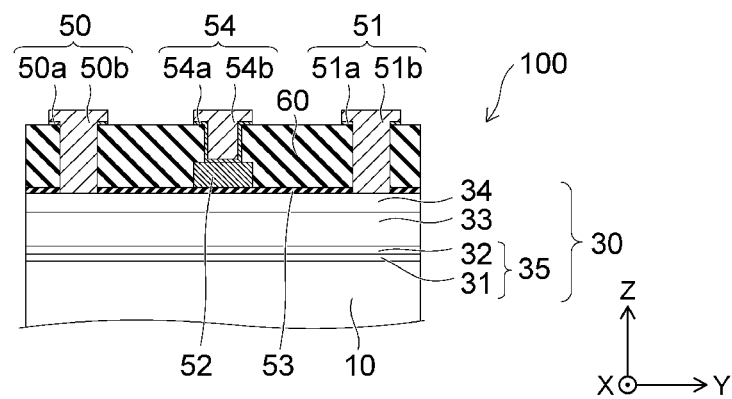
FIG. 1B is a schematic sectional view which shows the principal portion of the semiconductor device according to the first embodiment.
Figure 1C:
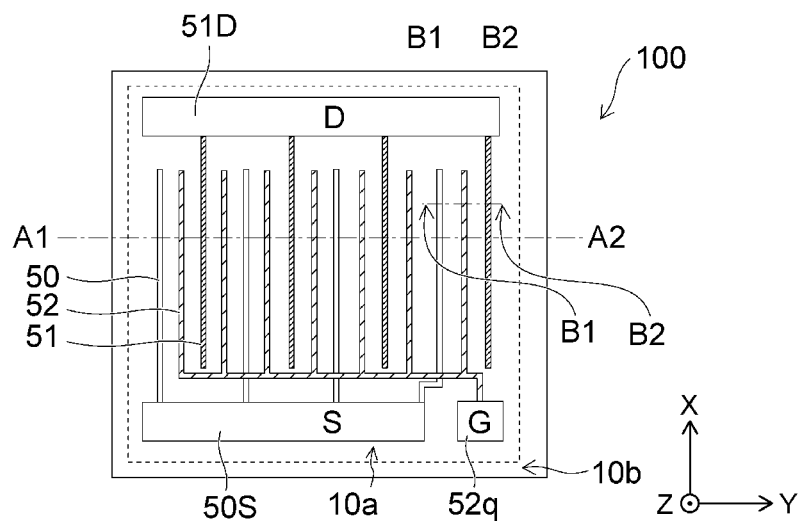
FIG. 1C is a schematic plan view which shows the principal portion of the semiconductor device according to the first embodiment.

FIG. 1A is a schematic sectional view which shows a principal portion of a semiconductor device according to a first embodiment. FIG. 1B is a schematic sectional view which shows a principal portion of the semiconductor device according to the first embodiment. FIG. 1C is a schematic plan view which shows a principal portion of the semiconductor device according to the first embodiment.

FIG. 1A shows a cross-section taken along line A1-A2 of FIG. 1C. FIG. 1B shows a cross-section taken along line B1-B2 of FIG. 1C. FIG. 1C shows a transparent view of an electrode as FIG. 1A is viewed from the above.

A semiconductor device 100 according to the first embodiment is a high electron mobility transistor (HEMT) as an example. The semiconductor device 100 includes, for example, a semiconductor substrate 10, a nitride semiconductor layer 30 which includes a plurality of nitride semiconductor regions, a first electrode (hereinafter, for example, source electrode 50), a second electrode (hereinafter, for example, drain electrode 51), a third electrode (hereinafter, for example, gate electrode 52), a second insulating film (hereinafter, for example, gate insulating film 53), and a protective layer 60.

The semiconductor substrate 10 is, for example, silicon (Si). The semiconductor substrate 10 includes a first surface (hereinafter, for example, top surface 10u) and a second surface (hereinafter, for example, bottom surface 10d) on a side thereof opposite to the bottom surface 10d in a Z direction. The semiconductor substrate 10 includes a first region 10a in which a distance d1 between the bottom surface 10d and the top surface 10u is selectively short. The first region 10a is adjacent to a second region 10b. Here, "being adjacent" means not only being directly in contact but also being aligned apart. For example, the first region 10a is surrounded by the second region 10b of the semiconductor substrate 10 except for the first region 10a (FIG. 1B). That is, a thickness of the first region 10a is thinner than a thickness of the second region 10b in the Z direction. In addition, the substrate is not limited to the semiconductor substrate 10 including silicon, but may be a sapphire substrate or the like.

The nitride semiconductor layer 30 is provided in the first region 10a of the semiconductor substrate 10. The nitride semiconductor layer 30 is provided on the top surface 10u of the semiconductor substrate 10. At least a portion of a side wall 30w of the nitride semiconductor layer 30 is in contact with the semiconductor substrate 10.

In the embodiments, a portion 30p of the nitride semiconductor layer 30 includes a plurality of nitride semiconductor regions stacked in the Z direction. The plurality of nitride semiconductor regions are a buffer layer 35, a carrier transit or channel layer 33, and a barrier layer 34. Furthermore, the nitride semiconductor layer 30 includes the buffer layer 35, the carrier transit layer 33, and the barrier layer 34 provided on side walls 10bw of the second region 10b. The barrier layer 34 in the plurality of nitride semiconductor regions stacked in the Z direction is a nitride semiconductor region on a top layer of the nitride semiconductor layer 30. The carrier transit or channel layer 33 includes non-doped gallium nitride (GaN) or non-doped aluminum gallium nitride ($Al_XGa_{1-X}N$ ($0 \leq X < 1$)). The barrier layer 34 includes non-doped or n-type aluminum gallium nitride ($Al_YGa_{1-Y}N$ ($0 < Y \leq 1$, $X < Y$)). A two-dimensional electron (2 DEG) is generated in the carrier transit or channel layer 33 in a vicinity of an interface between the carrier transit or channel layer 33 and the barrier layer 34.

The buffer layer 35 includes a first buffer layer 31 containing aluminum nitride and a second buffer layer 32 containing aluminum gallium nitride. Among the nitride semiconductor layers 30 stacked in the Z direction, the first buffer layer 31 is in a nitride semiconductor region of a bottom layer of the nitride semiconductor layer 30. The second buffer layer 32 is provided on the first buffer layer 31. For example, the first buffer layer 31 is provided along the top surface 10u of the first region 10a and the side wall 10bw of the second region 10b of the semiconductor substrate 10. That is, the first buffer layer 31 is in contact with the first region 10a and the second region 10b of the semiconductor substrate 10. In the semiconductor device 100, the first buffer layer 31 forms the side wall 30w of the nitride semiconductor layer 30. In addition, the second buffer layer 32 is provided over the first buffer layer 31 along the side wall 10bw of the first region 10a and the second region 10b of the semiconductor substrate 10.

A distance d2 between atop surface 30u (or, atop surface of the barrier layer 34) of the nitride semiconductor layer 30 and the bottom surface 10d of the semiconductor substrate 10 is substantially the same as a distance d3 between the top surface 10u and the bottom surface 10d of the second region 10b of the semiconductor substrate 10. Here, being substantially the same means a case when a difference between the distance d2 and the distance d3 is several μm (for example, about 1 μm), and a case when the distance d2 and the distance d3 are the same as each other.

The source electrode 50 is provided on the top surface 30u of the nitride semiconductor layer 30. The source electrode 50 includes a barrier electrode 50a and a contact electrode 50b. A drain electrode 51 is provided on the top surface 30u of the nitride semiconductor layer 30. The drain electrode 51 includes a barrier electrode 51a and a contact electrode 51b. The gate electrode 52 is provided over a gate insulating film 53 on the top surface 30u of the nitride semiconductor layer 30 at a location between the source electrode 50 and the drain electrode 51. In addition, the gate electrode 52 may be provided on the top surface 30u of the nitride semiconductor layer 30 without the presence of an intervening gate insulating film 53. The number of the source electrodes 50, the drain electrodes 51, and the gate electrodes 52 are not limited to the shown numbers. An electrode 54 including a barrier electrode 54a and a contact electrode 54b is connected to the gate electrode 52.

The source electrode 50 and the drain electrode 51 are in ohmic contact with the barrier layer 34. The gate insulating film 53 includes one of a silicon nitride ($Si_3N_4$), a silicon oxide film ($SiO_2$), and an aluminum oxide ($Al_2O_3$). The protective layer 60 is a passivation layer which protects the nitride semiconductor layer 30, the gate insulating film 53, and the like, and includes, for example, a silicon nitride.

In addition, wirings electrically connected to each of the source electrode 50, the drain electrode 51, and the electrode 54, an interlayer insulating film between wirings, and the like may be provided on the protective layer 60 in the semiconductor device 100 (not shown).

A plurality of source electrodes 50 are connected to, for example, an electrode 50S. A plurality of drain electrodes 51 are connected to, for example, an electrode 51D. The plurality of source electrodes 50 extend to a side of the electrode 51D from the electrode 50S. The plurality of source electrodes 50 are aligned in, for example, a Y direction. The plurality of drain electrodes 51 extends to a side of the electrode 50S from the electrode 51D. The plurality of drain electrodes 51 are aligned in, for example, the Y direction. A plurality of gate electrodes 52 are connected to, for example, an electrode 52G.

An example of a manufacturing process of the semiconductor device 100 will be described.

FIGS. 2A to 6B are schematic sectional views which show a manufacturing process of the principal portion of the semiconductor device according to the first embodiment.

Figure 2A:
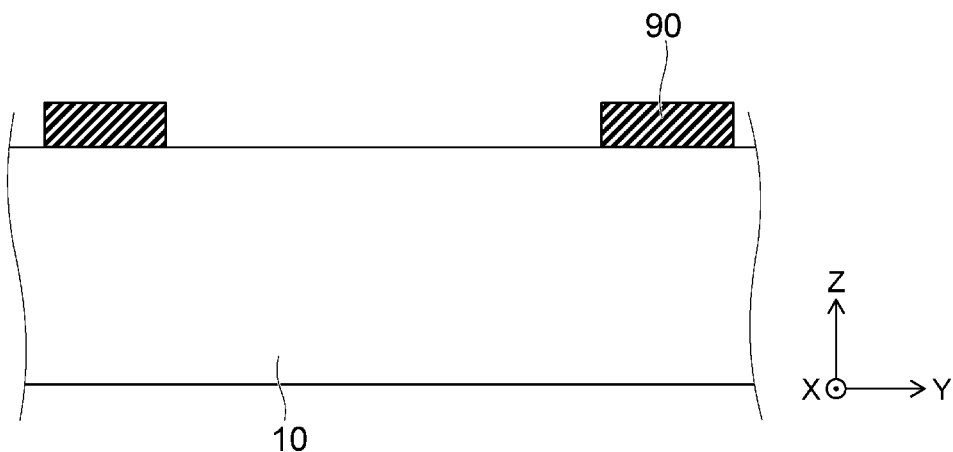
FIGS. 2A to 2C are schematic sectional views which show a manufacturing process of the principal portion of the semiconductor device according to the first embodiment.

For example, as shown in FIG. 2A, a mask layer 90 is selectively formed using photolithography and etching techniques on the semiconductor substrate 10. The semiconductor substrate 10 at this stage is not diced. Backside polishing may be performed on the semiconductor substrate 10 when necessary.

Figure 2B:
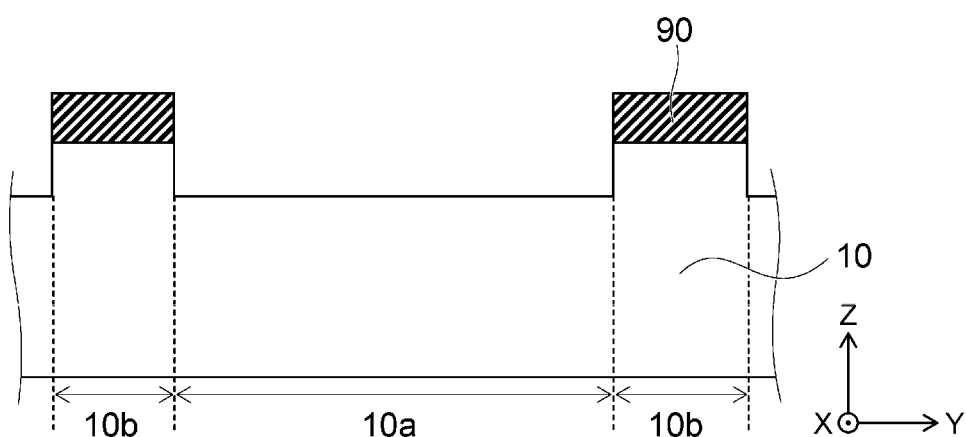

Next, as shown in FIG. 2B, the semiconductor substrate 10 is exposed in regions where the mask layer 90 has been removed, and is there etched by the reactive ion etching (RIE) method. Accordingly, a recessed region in which the semiconductor substrate 10 is selectively etched, that is, the first region 10a, is formed in the semiconductor substrate 10. In addition, a region surrounding the first region 10a is the second region 10b. Thereafter, the mask layer 90 is removed.

Figure 2C:
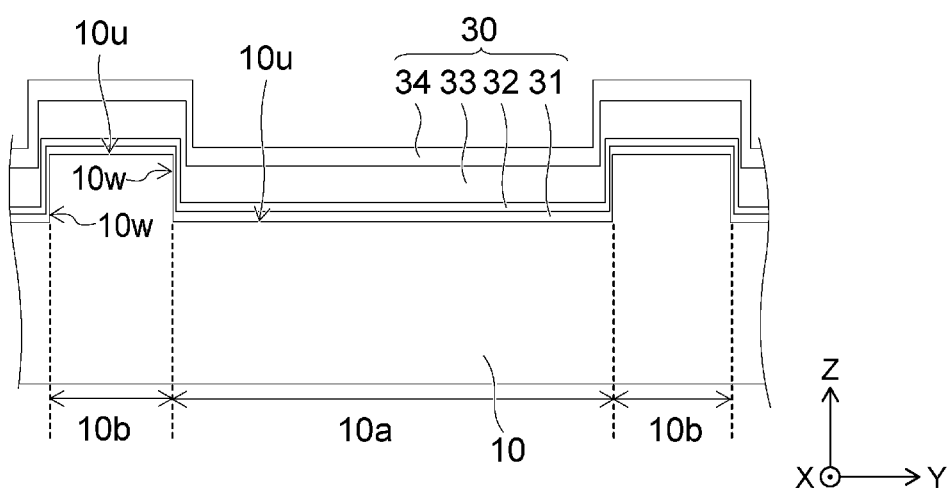

Next, as shown in FIG. 2C, the nitride semiconductor layer 30 including the plurality of nitride semiconductor regions is formed on the semiconductor substrate 10. For example, the first buffer layer 31, the second buffer layer 32, the carrier transit or channel layer 33, and the barrier layer 34 are epitaxially grown in this order along the top surface 10u and the side wall 10w of the first region 10a and the top surface 10u of the second region 10b. The first region 10a having a recess shape is provided in the semiconductor substrate 10, and thereby a difference is generated between the nitride semiconductor layer 30 on the first region 10*a* and the nitride semiconductor layer 30 on the second region 10*b*.

Figure 3A:
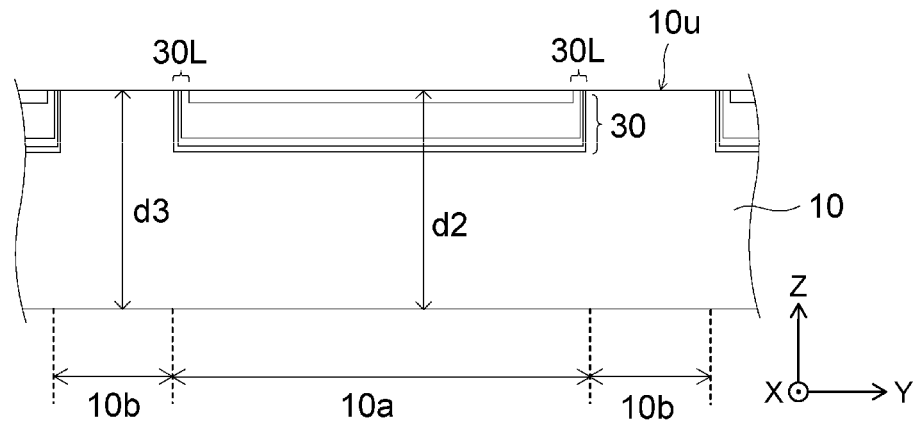
FIGS. 3A to 3C are schematic sectional views which show a manufacturing process of the principal portion of the semiconductor device according to the first embodiment.

Then, as shown in FIG. 3A, the semiconductor substrate 10 except for the recessed region, that is, the nitride semiconductor layer 30 formed on the second region 10*b* is removed by chemical mechanical polishing (CMP) processing. For example, until the semiconductor substrate 10 under the nitride semiconductor layer 30 in the second region 10*b* is exposed during polishing, the nitride semiconductor layer is thinned and removed. Accordingly, a structure body in which the distance d2 and the distance d3 are substantially the same as each other is formed. In other words, a top surface of this structure body is flat.

The first buffer layer 31, the second buffer layer 32, the carrier transit or channel layer 33, and the barrier layer 34 are formed along the top surface 10*u* and the side wall 10*w* of the first region 10*a*, such that each interface among the first buffer layer 31, the second buffer layer 32, the carrier transit layer 33, and the barrier layer 34 is exposed to a side of the top surface 10*u* of the semiconductor substrate 10. An exposed portion of the interface is set to be an interface exposed portion 30L.

Figure 3B:
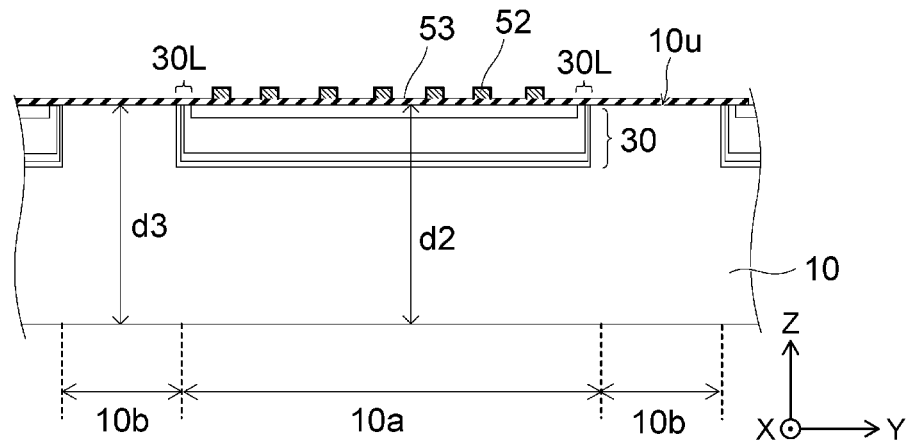

Then, as shown in FIG. 3B, the gate insulating film 53 is formed on the top surface 30*u* of the nitride semiconductor layer 30 and the top surface 10*u* of the semiconductor substrate 10. Accordingly, the interface exposed portion 30L is covered with the gate insulating film 53. Thereafter, the gate electrode 52 is selectively formed on the gate insulating film 53 of the first region 10*a* using, for example, a sputtering method, photolithography, etching, and the like.

Figure 3C:
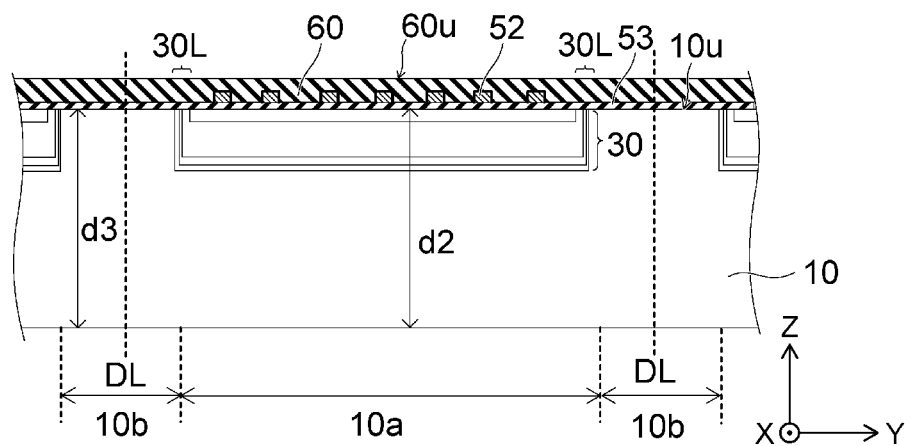

Then, as shown in FIG. 3C, the protective layer 60 is formed on the top surface 30*u* of the nitride semiconductor layer 30, the top surface 10*u* of the semiconductor substrate 10, and a top surface 52*u* of the gate electrode 52. A top surface 60*u* of the protective layer 60 is substantially planarized as the distance d2 and the distance d3 are substantially the same as each other.

Thereafter, the manufacturing process of the semiconductor device according to the first embodiment will be described using an enlarged view of a vicinity of the dicing line DL.

Figure 4A:
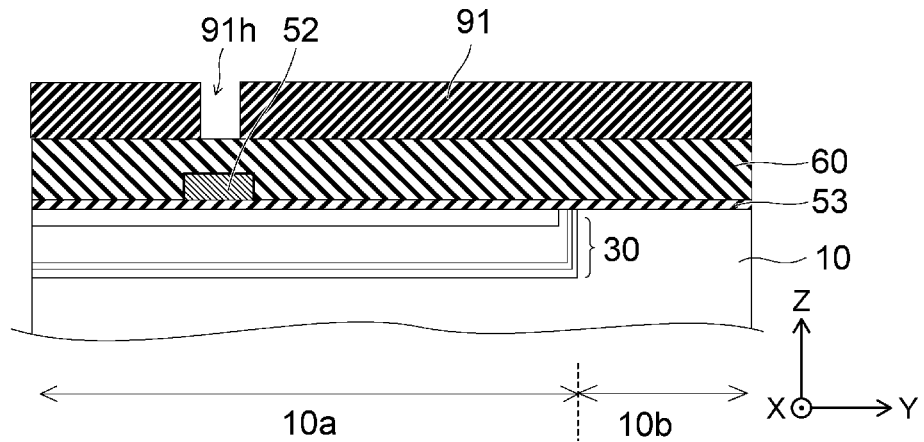
FIGS. 4A to 4C are schematic sectional views which show a manufacturing process of the principal portion of the semiconductor device according to the first embodiment.

Then, as shown in FIG. 4A, a mask layer 91 having an opening 91*h* is formed in the mask layer 91 over the gate electrode 52 using photolithography and etching techniques.

Figure 4B:
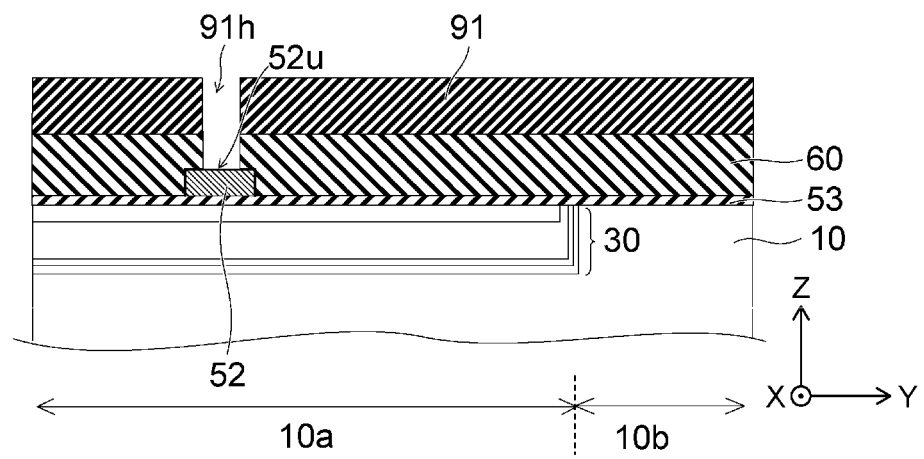

Then, as shown in FIG. 4B, the protective layer 60 exposed by the opening in the mask layer 91 is removed using the RIE method, and the top surface 52*u* of the gate electrode 52 is exposed through the protective layer 60. Thereafter, the mask layer 91 is removed.

Figure 4C:
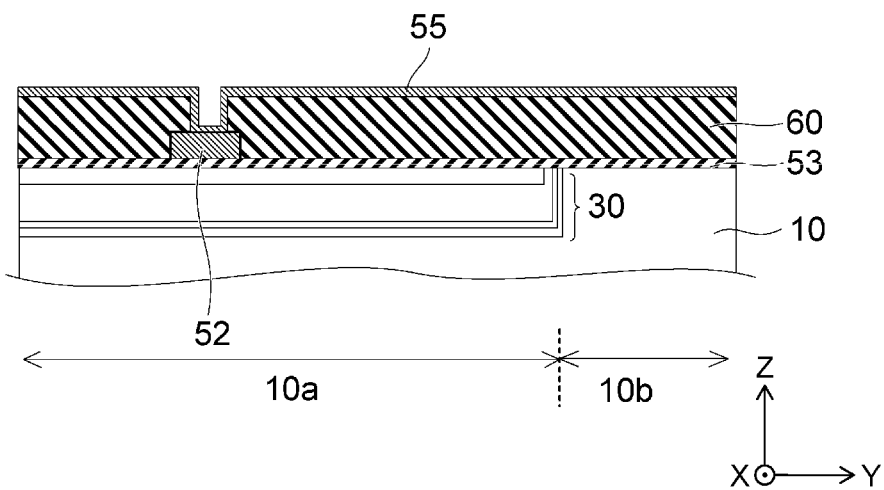

Then, as shown in FIG. 4C, the barrier layer 55 is formed on the gate electrode 52 and along a surface of the protective layer 60.

Figure 5A:
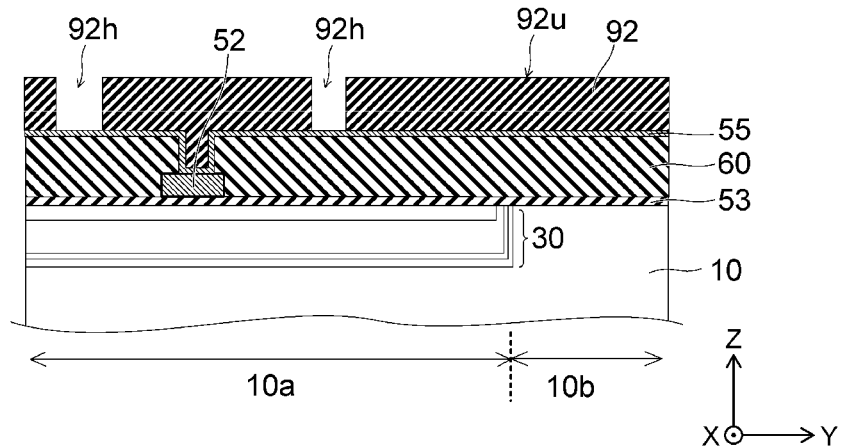
FIGS. 5A to 5C are schematic sectional views which show the manufacturing process of the principal portion of the semiconductor device according to the first embodiment.

Then, as shown in FIG. 5A, a patterned mask layer 92 is formed on the barrier layer 55 using photolithography and etching techniques. The mask layer 92 includes, for example, a resist. In the mask layer 92, an opening 92*h* is provided in a region in which the source electrode 50 and the drain electrode 51 are to be provided. The top surface 92*u* of the mask layer 92 is substantially planarized as the top surface 60*u* of the protective layer 60 is substantially planarized.

Figure 5B:
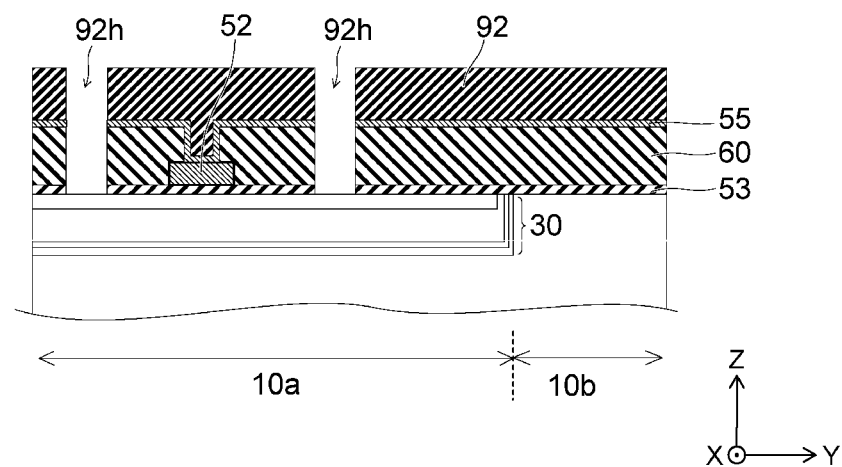

Then, as shown in FIG. 5B, the barrier layer 55 and the protective layer 60 exposed by the openings in the mask layer 92 are removed using the RIE method. Furthermore, the gate insulating film 53 under the opening 92*h* is removed. Accordingly, the barrier layer 34 of a region in which the source electrode 50 and the drain electrode 51 are provided is exposed. Thereafter, the mask layer 92 is removed.

Figure 5C:
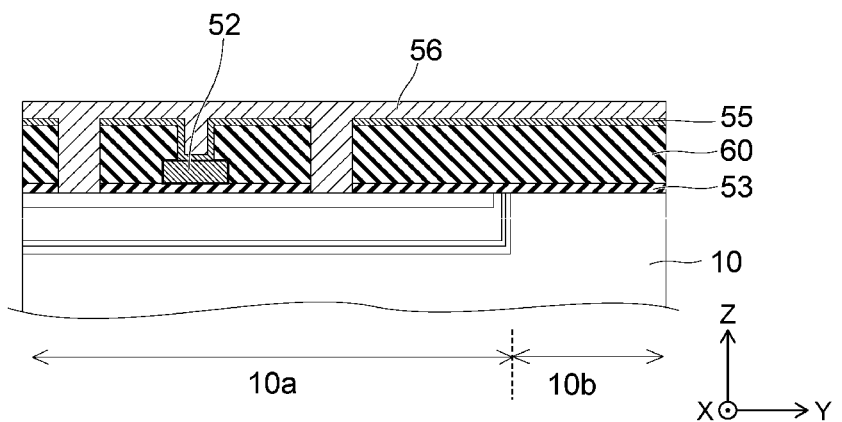

Then, as shown in FIG. 5C, an electrode layer 56 is formed on the exposed barrier layer 34 and on the barrier layer 55. Thereafter, the electrode layer 56 and the barrier layer 55 are divided as shown in FIG. 1A using, for example, the RIE method. Each of the divided barrier layer 55 becomes a barrier electrode 54*a*, a barrier electrode 50*a*, and a barrier electrode 51*a*. In addition, each of the divided electrode layer 56 becomes a contact electrode 54*b*, a contact electrode 50*b*, and a contact electrode 51*b*. Furthermore, after this, wirings electrically connected to each of the source electrode 50, the drain electrode 51, and the electrode 54, an interlayer insulating film between wirings, and the like may be provided on the protective layer 60 (not shown).

Figure 6A:
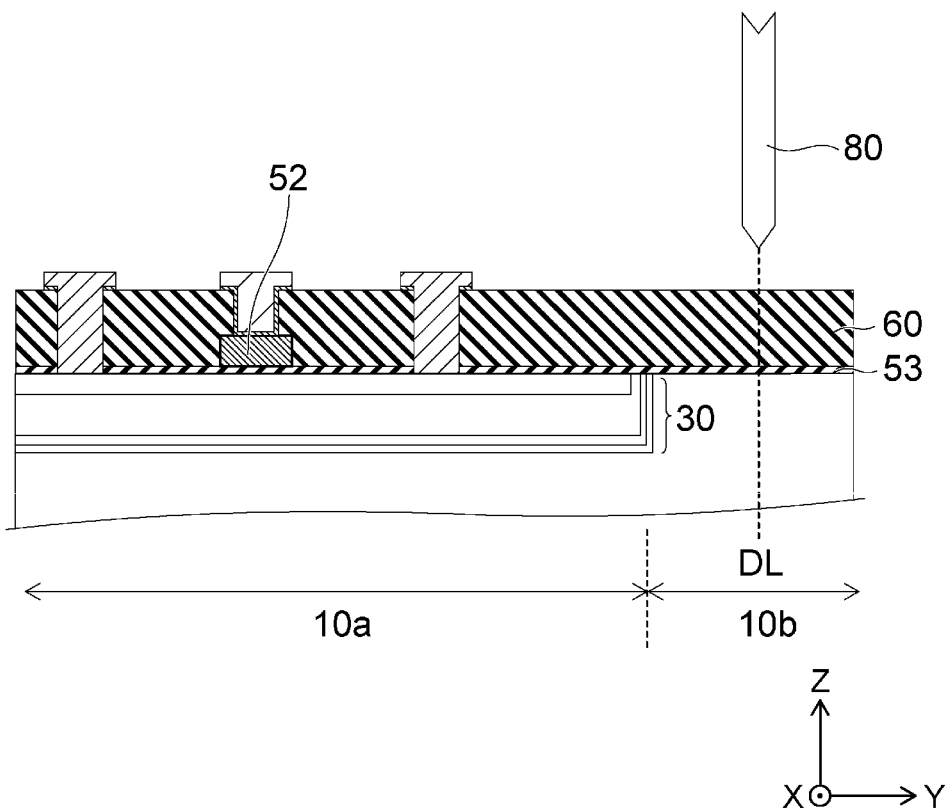
FIGS. 6A to 6B are schematic sectional views which show the manufacturing process of the principal portion of the semiconductor device according to the first embodiment.
Figure 6B:
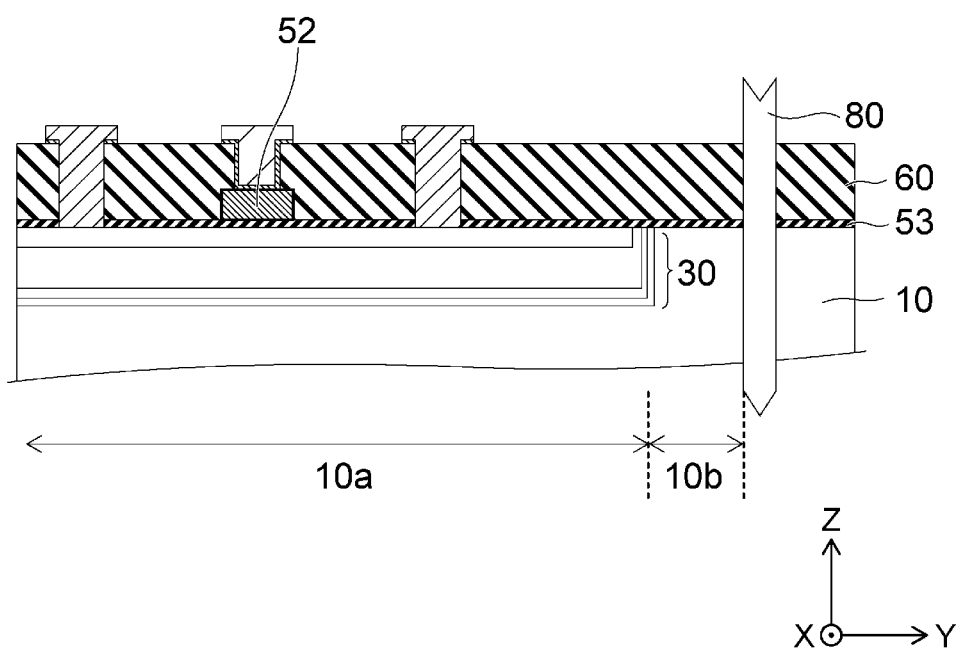

Then, as shown in FIG. 6A, a dicing blade 80 is placed on an upper side of the semiconductor substrate 10 at a location other than the recessed region, that is, the second region 10*b*. The second region 10*b* includes a dicing line DL. Then, as shown in FIG. 6B, the dicing blade 80 is lowered to cut the semiconductor substrate 10. Accordingly, the semiconductor substrate 10 is diced and a plurality of semiconductor devices 100 are formed from the semiconductor substrate 10.

Before describing an effect according to the first embodiment, a manufacturing process of the semiconductor device according to a reference example will be described.

FIGS. 7A to 9B are schematic sectional views which show the manufacturing process of the semiconductor device according to a reference example.

Figure 7A:
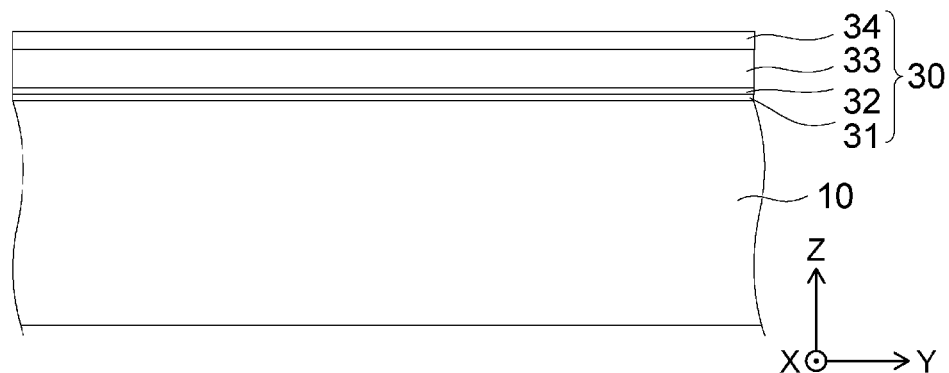
FIGS. 7A to 7C are schematic sectional views which show the manufacturing process of the semiconductor device according to a reference example.

In the reference example, the manufacturing process proceeds without forming the recessed region in the semiconductor substrate 10. For example, as shown in FIG. 7A, the nitride semiconductor layer 30 including the plurality of nitride semiconductor regions is formed on the semiconductor substrate 10.

Figure 7B:
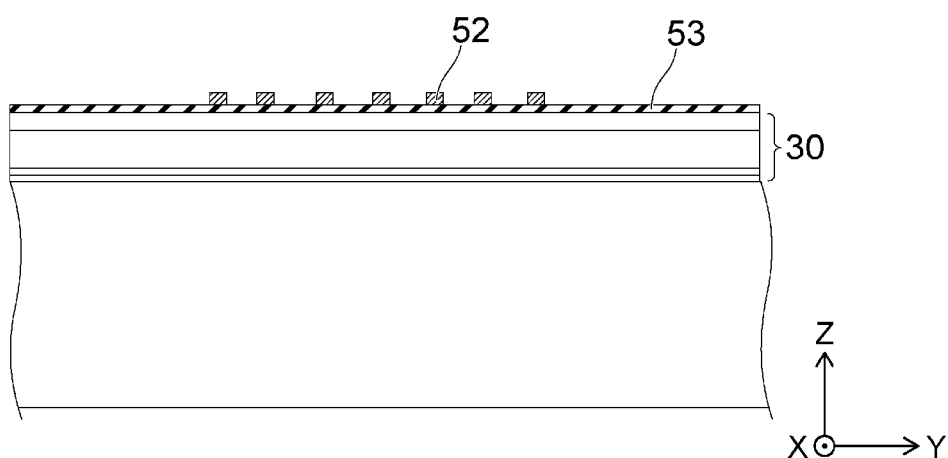

Then, as shown in FIG. 7B, the gate insulating film 53 is formed on the top surface 30*u* of the nitride semiconductor layer 30. After this, the gate electrode 52 is selectively formed on the gate insulating film 53.

Figure 7C:
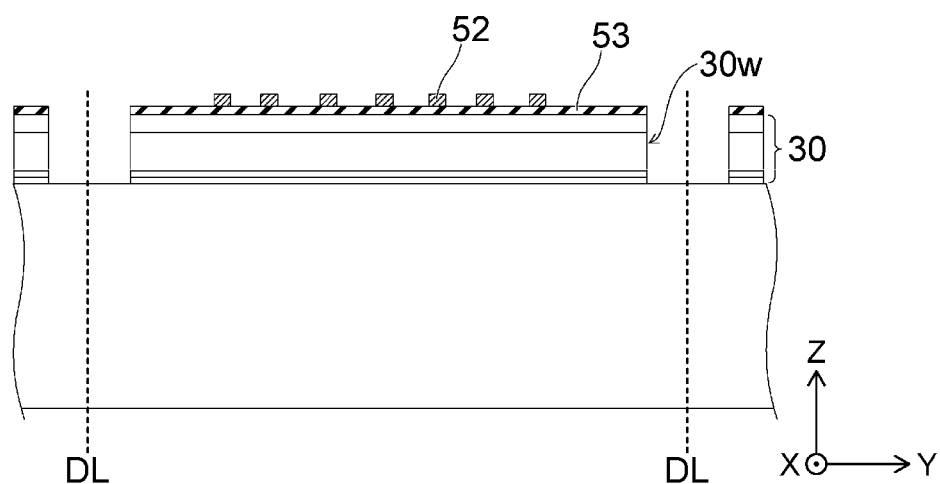

Then, as shown in FIG. 7C, the nitride semiconductor layer 30 in a vicinity of the dicing line DL is removed using, for example, the RIE method. Accordingly, the side wall 30*w* of the nitride semiconductor layer 30 is exposed in the vicinity of the dicing line DL in the reference example.

Figure 8A:
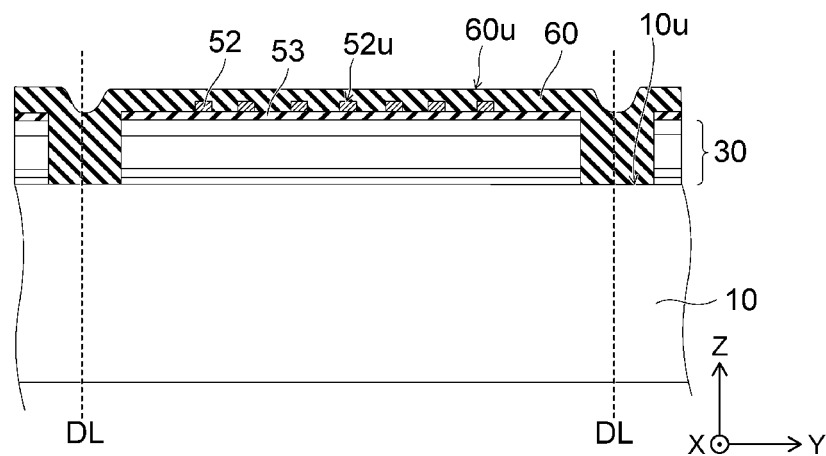
FIGS. 8A to 8C are schematic sectional views which show the manufacturing process of the semiconductor device according to a reference example.

Then, as shown in FIG. 8A, the protective layer 60 is formed on the top surface 30*u* of the gate insulating film 53, the top surface 10*u* of the semiconductor substrate 10, and the top surface 52*u* of the gate electrode 52. Since the nitride semiconductor layer 30 in the vicinity of the dicing line DL is removed, the top surface 60*u* of the protective layer 60 in the vicinity of the dicing line DL is recessed.

Thereafter, the manufacturing process of the semiconductor device according to the reference example will be described referring to an enlarged view of the vicinity of the dicing line DL.

Figure 8B:
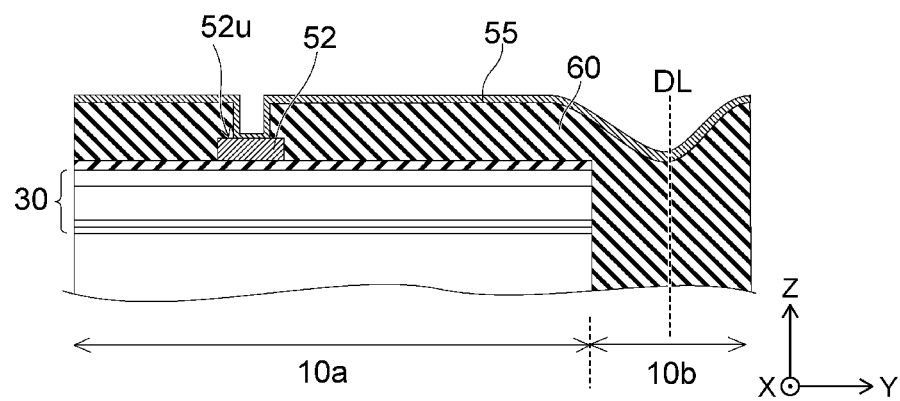

Next, as shown in FIG. 8B, the top surface 52*u* of the gate electrode 52 is exposed from the protective layer 60 to form the barrier layer 55 on the gate electrode 52 and along a surface of the protective layer 60.

Figure 8C:
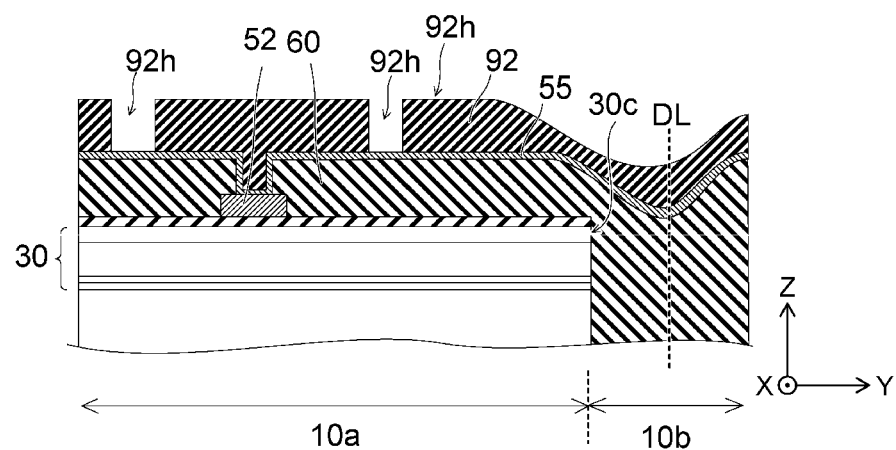

Then, as shown in FIG. 8C, a mask layer 92 is formed on the barrier layer 55 using the photolithography and the etching techniques. An opening 92*h* is provided in regions in which the source electrode 50 and the drain electrode 51 are provided in the mask layer 92.

However, in the reference example, a top surface 90u of the mask layer 92 is under an influence of a top surface shape of the protective layer 60 recessed in the vicinity of the dicing line DL. In addition, a fluidity of the resist makes a film thickness of the mask layer 92 in the vicinity of a corner 30c of the nitride semiconductor layer 30 relatively thin. In the reference example, when exposing the mask layer 92, precise locating and/or sizing of an opening in the vicinity of the dicing line DL is difficult and the opening may be misaligned with the underlying feature, or improperly sized or shaped.

Figure 9A:
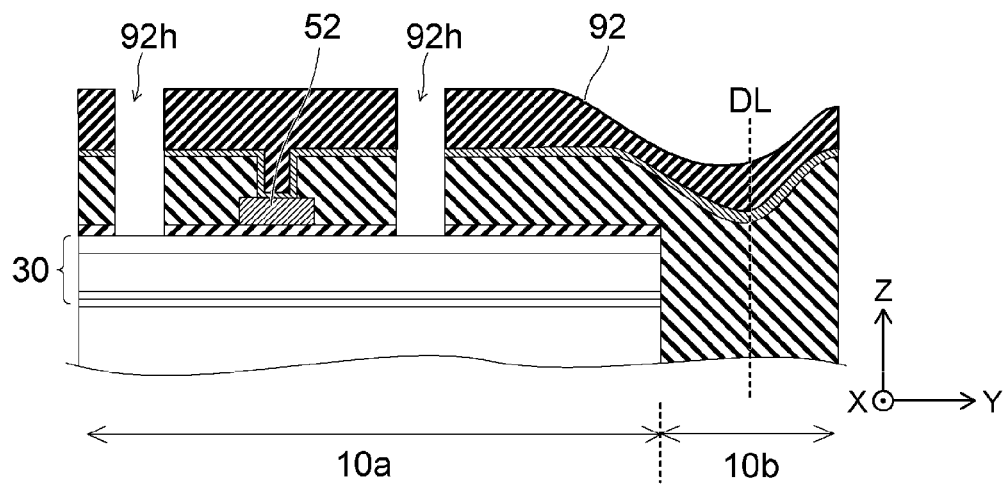
FIGS. 9A to 9B are schematic sectional views which show the manufacturing process of the semiconductor device according to a reference example.

Then, as shown in FIG. 9A, the barrier layer 55 exposed by the openings in the mask layer 92, and the protective layer 60 are removed by the RIE method. Furthermore, the gate insulating film 53 under the opening 92h is removed. Accordingly, the barrier layer 34 in the region in which the source electrode 50 and the drain electrode 51 are provided is exposed.

However, the entire top surface of the mask layer 92 is also etched by the RIE method. Accordingly, in the reference example, a portion of the mask layer 92 has a relatively thin portion, that is, the mask layer 92 in the vicinity of a corner 30c of the nitride semiconductor layer 30 has a film thickness far thinner than the remainder of the mask layer. Moreover, when the thin region of the mask layer 92 in the vicinity of the corner 30c of the nitride semiconductor layer 30 is etched through, the protective layer 60 under the mask layer 92 is exposed. Then, the exposed protective layer 60 is exposed to plasma, and the film thickness is reduced or is damaged due to the plasma exposure.

Figure 9B:
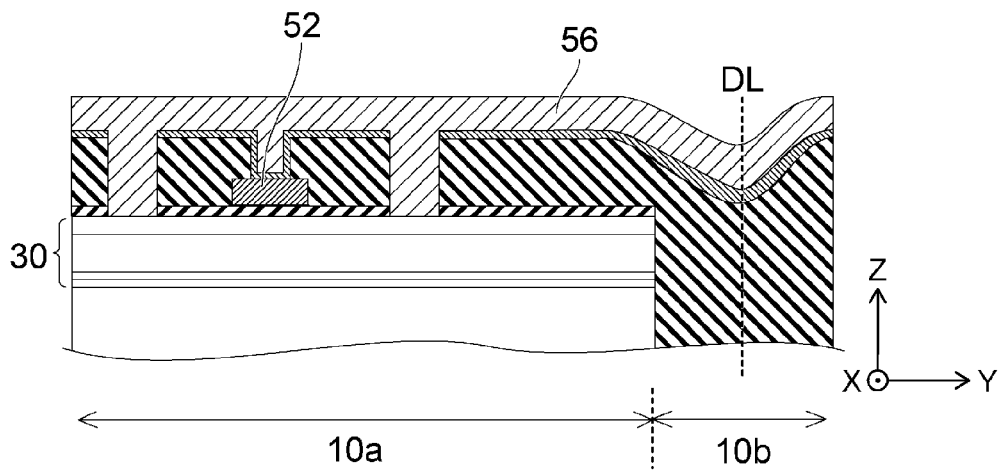

Then, after removing the mask layer 92, as shown in FIG. 9B, the electrode layer 56 is formed on the exposed barrier layer 34 and the barrier layer 55. Thereafter, as shown in the first embodiment, the barrier layer 55 and the electrode layer 56 are divided using the RIE method. Furthermore, the semiconductor substrate 10 is cut using the dicing line DL.

In the reference example, at a step before forming the protective layer 60, the side wall 30w of the nitride semiconductor layer 30 is exposed (FIG. 7C). That is, an interface of each layer which configures the nitride semiconductor layer 30 is exposed at the step before forming the protective layer 60. Accordingly, when a cleaning process or chemical treatment is performed before forming the protective layer 60, it is possible that water or chemical liquid enters into the nitride semiconductor layer 30 from the side wall 30w of the nitride semiconductor layer 30 and the interface between layers of the nitride semiconductor layer 30. Accordingly, the structure and/or functionality of the nitride semiconductor layer 30 may be deteriorated.

In contrast, in the first embodiment, at the step before forming the protective layer 60, the interface exposed portion 30L of the nitride semiconductor layer 30 is covered with the gate insulating film 53 (FIG. 3B). Accordingly, before forming the protective layer 60, it is difficult for water or chemical liquid to enter into the nitride semiconductor layer 30 from between layers of the nitride semiconductor layer 30. Accordingly, deterioration of the nitride semiconductor layer 30 is suppressed compared to the reference example.

In addition, in the first embodiment, the top surface 92u of the mask layer 92 formed on the protective layer 60 is substantially planarized. Accordingly, photolithographic feature alignment and focus performance when exposing the mask layer 92 is improved.

Moreover, in the first embodiment, the semiconductor substrate 10 which has a lower hardness than the nitride semiconductor layer 30 is cut by the dicing blade 80 in the dicing process. Accordingly, wear of the dicing blade 80 is suppressed to an extent of dicing a silicon substrate of the related art.

In addition, in the first embodiment, since the semiconductor substrate 10 is cut, the dicing blade 80 is not in contact with the nitride semiconductor layer 30. Accordingly, damage caused by a contact with the dicing blade 80 is not a result of contact with the nitride semiconductor layer 30.

Moreover, in the first embodiment, the bottom 30b and the side wall 30w of the nitride semiconductor layer 30 is in contact with the semiconductor substrate 10. Here, when a potential of the semiconductor substrate 10 is set as a predetermined potential (for example, a ground potential), the nitride semiconductor layer 30 is electrically shielded by the potential of the semiconductor substrate 10. That is, the nitride semiconductor layer 30 is minimally affected by a potential from the outside due to the presence of the semiconductor substrate 10 along the sides thereof.

Modification Example of First Embodiment

FIG. 10 is a schematic sectional view which shows the manufacturing process of the principal portion of the semiconductor device according to a modification example of the first embodiment.

In this example, when performing the CMP processing on the nitride semiconductor layer 30, for example, a portion of the first buffer layer 31 on a bottom layer is left on the top surface 10u of the semiconductor substrate 10. After this, the manufacturing process shown in FIGS. 3B to 6B is performed.

In this example, after forming the gate insulating film 53, the water or the chemical liquid hardly enter into the nitride semiconductor layer 30 from between layers of the nitride semiconductor layer 30. Accordingly, as compared to the first embodiment, deterioration of the nitride semiconductor layer 30 is further suppressed.

Second Embodiment

FIGS. 11A to 12B are schematic sectional views which show the manufacturing process of the principal portion of the semiconductor device according to a second embodiment.

For example, as shown in FIG. 11A, an insulating film 58 is formed on the semiconductor substrate 10. Furthermore, the mask layer 93 is selectively formed on the insulating film 58.

Then, as shown in FIG. 11B, the insulating film 58 exposed where the mask layer 93 is not present is selectively etched, and furthermore the semiconductor substrate 10 of a region from which the insulating film 58 is removed is selectively etched. Accordingly, a recessed region, that is, the first region 10a, is formed in the semiconductor substrate 10. The first region 10a is surrounded by the second region 10b.

Figure 12A:
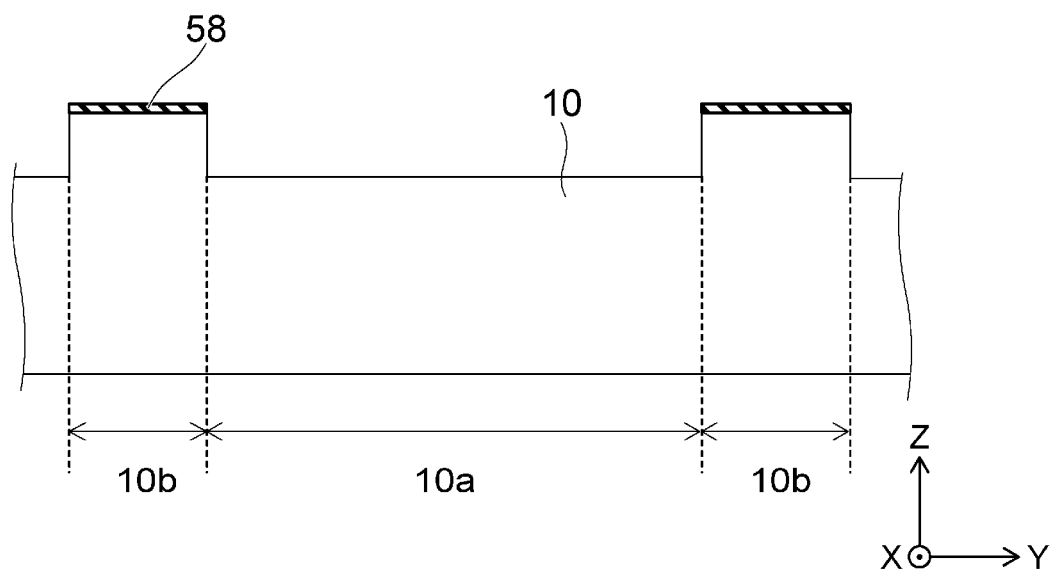
FIGS. 12A to 12B are schematic sectional views which show the manufacturing process of the principal portion of the semiconductor device according to the second embodiment.

Then, as shown in FIG. 12A, the mask layer 93 is removed. The insulating film 58 is formed on the second region 10b of the semiconductor substrate 10.

Figure 12B:
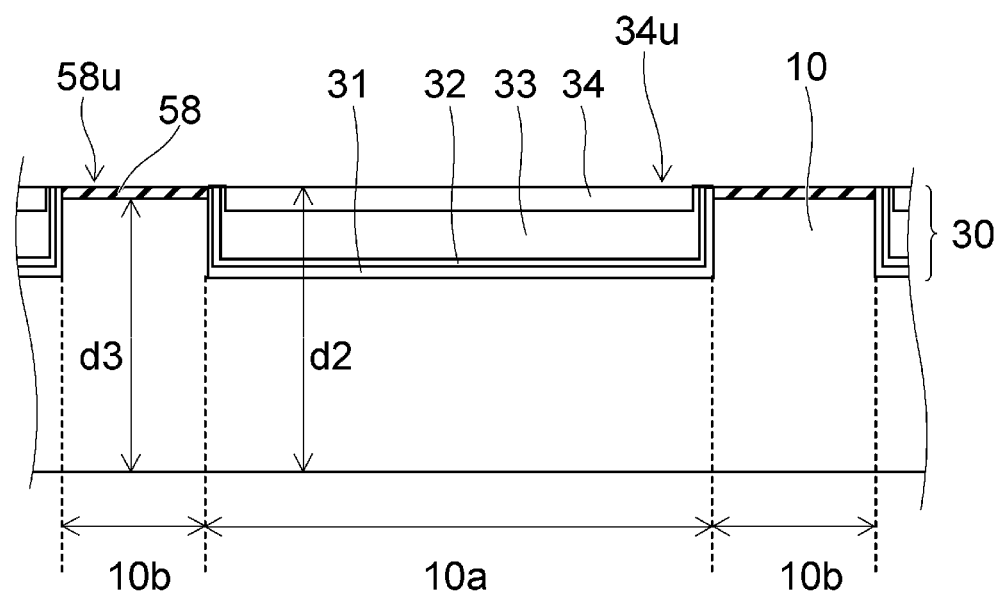

Then, as shown in FIG. 12B, the nitride semiconductor layer 30 is selectively formed on the exposed portions of the semiconductor substrate 10 not covered by the insulating film 58 by epitaxial growth. Since the insulating film 58 is formed on the second region 10b of the semiconductor substrate 10, the nitride semiconductor layer 30 is not grown on the second region 10b of the semiconductor substrate 10.

For example, when the nitride semiconductor layer 30 is grown so that a height of the top surface 58u of the insulating film 58 is substantially the same as a height of the top surface 34u of the barrier layer 34, or the height of the top surface 34u of the barrier layer 34 is higher than the height of the top surface 58u of the insulating film 58 and the distance d3 is shorter than the distance d2. After this, the manufacturing process shown in FIGS. 3B to 6B is performed.

According to the second embodiment, the nitride semiconductor layer 30 is selectively formed on the semiconductor substrate 10 exposed form the insulating film 58, such that the CMP process described above is not required. Accordingly, the nitride semiconductor layer 30 is not exposed to the water or the chemical liquid used in the CMP process. Accordingly, as compared to the first embodiment, water based deterioration of the nitride semiconductor layer 30 is further suppressed.

"Nitride semiconductor" in the present specification is collectively intended to include semiconductors of all compositions which change composition ratios x, y, and z within each range in a chemical formula of $B_xIn_yAl_zGa_{1-x-y-z}N$ ($0 \leq x \leq 1$, $0 \leq y \leq 1$, $0 \leq z \leq 1$, $x+y+z \leq 1$). Furthermore, in the chemical formula, "the nitride semiconductor" is also intended to include a semiconductor further containing group V elements except for nitrogen (N), a semiconductor further containing various elements added to control various physical properties such as conductivity type, and a semiconductor further containing various elements unintentionally included.

"On" in an expression of "A is provided or located on B" in the embodiment described above means not only a case where A is in contact with B to be provided on B, but also a case where A is provided above B without being in contact with B. In addition, "A is provided or located on B" allows A and B to be reversed and is applied to a case where A is positioned under B or a case where A and B are aligned side-by-side in some cases. This is because there is no change in a structure of the semiconductor device between before and after rotation even if the semiconductor device according to the embodiment is rotated.

The embodiments are described referring to specific examples. However, the embodiments are not limited to these specific examples. That is, these specific examples which are appropriately design modified by those skilled in the art are still within a scope of the embodiments as long as the examples include features of the embodiments. Each element including each specific example described above, and a disposition, material, condition, shape, size, and the like thereof are not limited to those exemplified, but may be appropriately changed.

In addition, each element included in each embodiment described above may be combined as long as technically possible, and a combination of these is included within the scope of the embodiment as long as the combination includes the features of the embodiments. Besides, those skilled in the art may conceive various changes and modification examples within a spirit of the embodiment, and these changes and modification examples are seen as within the scope of the embodiments.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
a substrate comprising a first region of a first material and a second region of the first material adjacent to the first region, and a thickness of the substrate in the first region is smaller than a thickness of the substrate in the second region;
a nitride semiconductor layer on a top surface of the substrate in the first region, a top surface of the nitride semiconductor layer being coplanar with the top surface of the substrate in second region, wherein the substrate includes bottom surface on a side opposite to the top surface, and
an insulating film is provided on the top surface of the substrate in the second region, and a distance between the top surface of the nitride semiconductor layer and the bottom surface of the substrate is longer than a distance between the bottom surface of the substrate and the top surface of the substrate in the first region.

2. The device according to claim 1, wherein
the nitride semiconductor layer includes a plurality of nitride semiconductor regions, and
a nitride semiconductor region on a bottom layer of the nitride semiconductor layer is in contact with the first region of the substrate and is in contact with the second region of the substrate.

3. The device according to claim 1, further comprising:
a first electrode on the nitride semiconductor layer;
a second electrode on the nitride semiconductor layer; and
a third electrode on the nitride semiconductor layer between the first electrode and the second electrode.

4. The device according to claim 1, wherein the first material of the substrate is silicon.

5. The device according to claim 1, wherein the second region surrounds the first region.

6. The device according to claim 1, further comprising:
an insulating layer on the second region, wherein a thickness of the substrate in the first region and a thickness of the nitride semiconductor layer together equal a thickness of the substrate in the second region plus a thickness of the insulating layer.

7. A semiconductor device comprising:
a substrate comprising a first region and a second region adjacent to the first region, the first and second region comprising a silicon material, and a thickness of the substrate in the first region is smaller than a thickness of the substrate in the second region;
a nitride semiconductor layer a top surface of the substrate in the first region, wherein a thickness of the substrate in the first region and a thickness of the nitride semiconductor layer together equal a thickness of the substrate in the second region, and wherein the substrate includes bottom surface on a side opposite to the top surface, and an insulating film is provided on the second region, and a distance between a top surface of the nitride semiconductor layer and the bottom surface of the substrate is longer than a distance between the bottom surface of the substrate and the top surface of the substrate in the first region.

8. The device according to claim 7, wherein
the nitride semiconductor layer includes a plurality of nitride semiconductor regions, and a nitride semiconductor region on a bottom layer of the nitride semiconductor layer is in contact with the first region of the substrate and is in contact with the second region of the substrate.

9. The device according to claim 7, further comprising:
a first electrode on the nitride semiconductor layer;
a second electrode on the nitride semiconductor layer; and
a third electrode on the nitride semiconductor layer between the first electrode and the second electrode.

10. The device according to claim 7, wherein the nitride semiconductor region includes a buffer layer, a carrier transit layer, and a channel layer.

11. The device according to claim 7, wherein the second region surrounds the first region.

12. The device according to claim 7, further comprising:
an insulating layer on the second region, wherein a thickness of the substrate in the first region and a thickness of the nitride semiconductor layer together equal a thickness of the substrate in the second region plus a thickness of the insulating layer.

13. A semiconductor device comprising:
a substrate comprising a first region and a second region adjacent to the first region, and in which a thickness of the first region is smaller than a thickness of the second region;
a nitride semiconductor layer on the first region of the substrate; and
an insulating layer on the second region, wherein a thickness of the substrate in the first region and a thickness of the nitride semiconductor layer together equal a thickness of the substrate in the second region plus a thickness of the insulating layer.

14. The device according to claim 13, wherein
the nitride semiconductor layer includes a plurality of nitride semiconductor regions, and
a nitride semiconductor region on a bottom layer of the nitride semiconductor layer is in contact with the first region of the substrate and is in contact with the second region of the substrate.

15. The device according to claim 14, wherein
the substrate includes a first surface at a side on which the nitride semiconductor layer is provided and a second surface on a side opposite to the first surface, and
a first insulating film is provided on the second region, and a distance between a top surface of the nitride semiconductor layer and the second surface is shorter than a distance between the second surface and the first surface of the substrate.

16. The device according to claim 13, further comprising:
a first electrode on the nitride semiconductor layer;
a second electrode on the nitride semiconductor layer; and
a third electrode on the nitride semiconductor layer between the first electrode and the second electrode.

17. The device according to claim 13, wherein a thickness of the substrate in the first region and a thickness of the nitride semiconductor layer together equal a thickness of the substrate in the second region.

18. The device according to claim 13, wherein the second region surrounds the first region.

* * * * *